United States Patent
Harada et al.

(10) Patent No.: US 11,452,204 B2
(45) Date of Patent: Sep. 20, 2022

(54) CERAMIC CIRCUIT BOARD, METHOD FOR MANUFACTURING CERAMIC CIRCUIT BOARD, AND MODULE USING CERAMIC CIRCUIT BOARD

(71) Applicant: DENKA COMPANY LIMITED, Tokyo (JP)

(72) Inventors: Yusaku Harada, Omuta (JP); Akimasa Yuasa, Omuta (JP); Takahiro Nakamura, Omuta (JP); Shuhei Morita, Omuta (JP); Kouji Nishimura, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 28 days.

(21) Appl. No.: 16/606,405

(22) PCT Filed: Apr. 24, 2018

(86) PCT No.: PCT/JP2018/016540
§ 371 (c)(1),
(2) Date: Oct. 18, 2019

(87) PCT Pub. No.: WO2018/199060
PCT Pub. Date: Nov. 1, 2018

(65) Prior Publication Data
US 2020/0128664 A1    Apr. 23, 2020

(30) Foreign Application Priority Data
Apr. 25, 2017    (JP) .............................. JP2017-086504

(51) Int. Cl.
*H05K 1/03*    (2006.01)
*C04B 37/02*    (2006.01)
*H01L 23/373*    (2006.01)

(52) U.S. Cl.
CPC ......... *H05K 1/0306* (2013.01); *C04B 37/026* (2013.01); *H01L 23/3735* (2013.01);
(Continued)

(58) Field of Classification Search
CPC ................ H05K 1/0306; C04B 37/026; C04B 2237/125; C04B 2237/366; C04B 2237/368; C04B 2237/407
(Continued)

(56) References Cited

U.S. PATENT DOCUMENTS
2015/0208496 A1    7/2015    Terasaki et al.

FOREIGN PATENT DOCUMENTS
JP    H11-157952 A    6/1999
JP    2002-274964 A    9/2002
(Continued)

OTHER PUBLICATIONS

Iwamoto et al., JP 4674983 B2 machine translation, Apr. 20, 2011, entire machine translation (Year: 2011).*
In et al., JP 2016-169111 A, machine translation, Sep. 23, 2016, entire translation (Year: 2016).*
Goto et al., JP 2014-090144 A, machine translation, May 15, 2014, entire translation (Year: 2014).*
(Continued)

*Primary Examiner* — Humera N. Sheikh
*Assistant Examiner* — Katherine A Christy
(74) *Attorney, Agent, or Firm* — Oliff PLC

(57) ABSTRACT

A ceramic circuit substrate and power module with excellent heat cycle resistance characteristics, which is formed by bonding a ceramic substrate and a copper plate via a brazing material including Ag, Cu, and an active metal, wherein the bond void fraction is no greater than 1.0% and the diffusion distance of the Ag, which is a brazing material component, is 5-20 μm. Also, a method for manufacturing a ceramic circuit substrate characterized in that the heating time in a temperature range 400-700° C. in a process for raising the temperature to a bonding temperature is 5-30 minutes and
(Continued)

bonding is performed by maintaining the bonding temperature at 720-800° C. for 5-30 minutes.

16 Claims, 1 Drawing Sheet

(52) U.S. Cl.
    CPC .. *C04B 2237/125* (2013.01); *C04B 2237/366* (2013.01); *C04B 2237/368* (2013.01); *C04B 2237/407* (2013.01)

(58) Field of Classification Search
    USPC .......................................................... 428/621
    See application file for complete search history.

(56) References Cited

FOREIGN PATENT DOCUMENTS

| JP | 2003-188310 A | | 7/2003 |
|----|---------------|---|--------|
| JP | 4674983 B2 | * | 4/2011 |
| JP | 2014-090144 A | * | 5/2014 |
| JP | 2014-187411 A | | 10/2014 |
| JP | 2016-169111 A | * | 9/2016 |

OTHER PUBLICATIONS

Jun. 12, 2018 International Search Report issued in International Patent Application No. PCT/JP2018/016540.
Mar. 10, 2020 Extended Search Report issued in European Patent Application No. 18792227.3.

* cited by examiner

CERAMIC CIRCUIT BOARD, METHOD FOR MANUFACTURING CERAMIC CIRCUIT BOARD, AND MODULE USING CERAMIC CIRCUIT BOARD

TECHNICAL FIELD

The present invention pertains to a ceramic circuit substrate, a manufacturing method therefor, and a power module using the same.

BACKGROUND ART

Ceramic circuit substrates in which metal circuit substrates and metal heat dissipation boards are bonded to surfaces of a ceramic substrate are used in power modules directed to railways, vehicles, and industrial machines which require high voltage and high current operation. Alongside increasing output and integration of semiconductor elements in recent years, the amount of heat from semiconductor elements has continued to grow and ceramic substrates formed from a silicon nitride sintered body or an aluminum nitride sintered body having high thermal conductivity are used to efficiently dissipate this heat.

Higher heat dissipation is demanded in vehicle-mounted power modules, in particular, and thinning ceramic substrates and thickening metal plates is being investigated. However, in such structures, the stress loads increase more and more during heat cycles due to differences in the coefficients of thermal expansion of the ceramic substrates and the metal plates, so cracks arise in the ceramic substrates, causing insulation failure, inviting heat transfer failure due to the metal plates separating, and lowering operational reliability as electronic devices.

Thermal stress during heat cycles is affected not only by the difference in the coefficients of thermal expansion of ceramic substrates and metal plates, but also by the mechanical properties possessed by the metal plates themselves, mainly tensile strength and yield strength, so if a bonding brazing material component is diffused in a metal plate, the property of ready plastic deformation is lost and residual stress forms, damaging the ceramic substrate. In order to suppress diffusion of a brazing material component to a metal plate and reduce thermal stress to the utmost, bonding at a low temperature and for a short time is necessary, but rapid temperature rises are difficult in conventional bonding in vacuum and temperature distributions readily occur in bonding ovens, and it is difficult to manufacture high-reliability ceramic circuit substrates with good productivity.

Thus, Patent Document 1 investigates controlling the thickness of a brazing material layer by forming a layer containing Ag and a nitride-forming element on at least one of a bonding surface of a ceramic substrate and a bonding surface of a copper plate and then bonding the surfaces. However, with this method, while the thickness of the brazing material layer continuously formed is controlled, the bonding temperature is high at no less than 790° C., so some of the Ag that is the brazing material component further diffuses in the copper plate thickness direction beyond the continuously formed brazing material layer and changes the mechanical properties of the copper plate. Furthermore, combined with an increase in the residual stress after bonding due to the difference in the coefficients of thermal expansion of the ceramic substrate and the copper plate, it was not possible to, for example, satisfy the heat cycle resistance characteristics demanded of a ceramic circuit substrate to which a copper plate with a thickness such as 0.8 mm is to be bonded. Further, the controlled thickness of the brazing material layer is a mean value measured in multiple areas excluding non-continuous brazing material layer areas, so cracks sometimes developed in the ceramic substrate at portions at which the brazing material layer was locally thick.

Patent Document 2 investigated bonding at 750-850° C. in a nitrogen atmosphere using a brazing material comprising zirconium, but due to the zirconium, which was added in large amounts to ensure bondability, the brazing material layer became fragile and there were problems such as the heat cycle resistance properties falling.

PRIOR ART

Patent Documents

[Patent Document 1] JP 2014-187411 A
[Patent Document 2] JP 2003-188310 A

SUMMARY OF INVENTION

Technical Problem

The objective of the present invention is to provide a ceramic circuit substrate with excellent heat cycle resistance characteristics, a manufacturing method therefor, and a module using the same.

Solution to Problem

The present invention employs the following means to solve the abovementioned problem.
(1) A ceramic circuit substrate formed by bonding a ceramic substrate and a copper plate via a brazing material comprising Ag, Cu, and an active metal, wherein the bond void fraction is no greater than 1.0% and the diffusion distance of the Ag, which is a brazing material component, is 5-20 μm.
(2) The ceramic circuit substrate according to (1), wherein the ceramic substrate comprises silicon nitride or aluminum nitride.
(3) The ceramic circuit substrate according to (1) or (2), wherein the brazing material comprises Sn.
(4) A manufacturing method for the ceramic circuit substrate according to any one of (1)-(3), characterized in that the heating time in the temperature range 400-700° C. in a process for raising the temperature to the bonding temperature is 5-30 minutes and bonding is performed by maintaining the bonding temperature at 720-800° C. for 5-30 minutes.
(5) The manufacturing method for a ceramic circuit substrate according to (4), characterized by bonding in a continuous heating furnace in a nitrogen atmosphere.
(6) A power module using the ceramic circuit substrate according to any one of (1)-(3).

Advantageous Effects of Invention

The ceramic circuit substrate of the present invention has excellent heat cycle resistance characteristics and thus high-performance power modules can be provided in a productive manner.

REFERENCE SIGNS LIST

Figure 1:
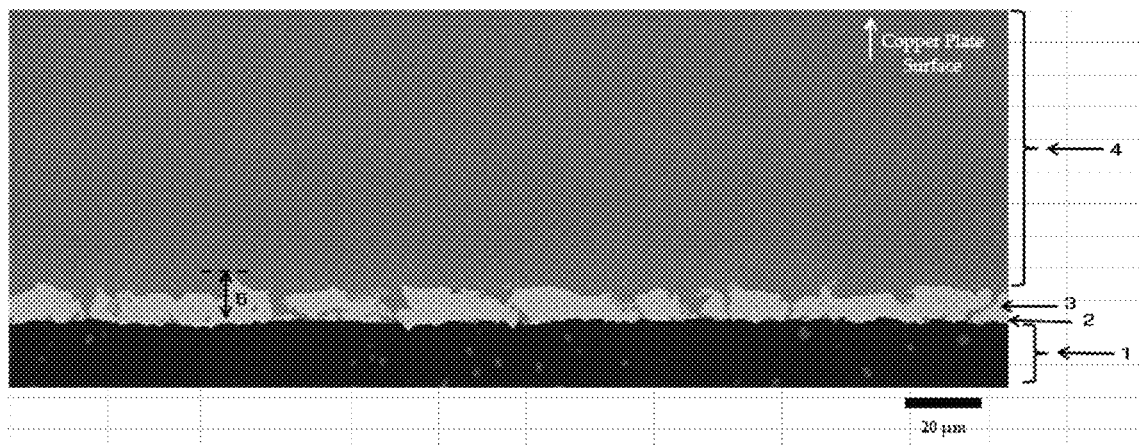
FIG. 1 An example of a cross-sectional photograph of a ceramic circuit substrate with an Ag diffusion distance of 12 μm (Example 1).
Figure 2:
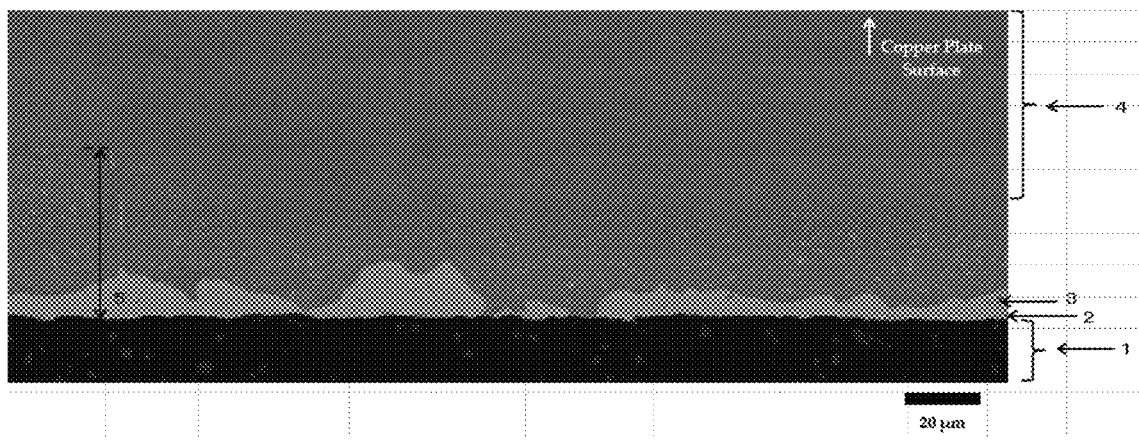
FIG. 2 An example of a cross-sectional photograph of a ceramic circuit substrate with an Ag diffusion distance of 42 µm (Comparative Example 1).

1 Ceramic substrate
2 Ceramic substrate surface
3 Ag
4 Copper plate
5 Ag diffusion distance

DESCRIPTION OF EMBODIMENTS

The ceramic circuit substrate of the present invention is a ceramic circuit substrate formed by bonding a copper circuit substrate to one surface of a ceramic substrate and bonding a copper heat dissipation board to the other surface via a brazing material comprising Ag, Cu, and an active metal.

The ceramic circuit substrate of the present invention is characterized by the bond void fraction being no greater than 1.0%. Here, the bond void fraction is an indicator that evaluates the bond state between the ceramic substrate and the copper plate and can be determined by measuring the surface area of the bond voids of the ceramic circuit substrate observed with an ultrasonic flaw detector and dividing by the surface area of the copper circuit pattern. By setting the bond void fraction to no greater than 1.0%, a decrease in the bond strength and separation of the copper plate during heat cycles can be suppressed. Further, a decrease in the partial discharge characteristics, etc. can also be suppressed, so the present invention can also be used as a ceramic circuit substrate for power modules.

The ceramic circuit substrate of the present invention is characterized by the diffusion distance of the Ag, which is a brazing material component, being 5-20 µm. Here, the diffusion distance of the Ag is the distance between the surface of the ceramic substrate and the portion at which the Ag diffused furthest from the surface of the ceramic substrate toward the surface of the copper plate (the direction perpendicular to the surface of the ceramic substrate) and is not always identical to the thickness of the continuous brazing material layer. 3 fields of view at a magnification of 500× in a scanning electron microscope are randomly selected from a cross-section of the ceramic circuit substrate (a 250 µm range in the horizontal direction of the bonding interface) such that the ranges do not overlap, and the Ag diffusion distance is the largest diffusion distance of the AG among those measured in the fields of view. Observation with the scanning electron microscope is carried out with a backscattered electron image. In the backscattered electron image, the detection intensity of Ag and Cu differ and the Ag is observed in a brighter color tone. The Ag and Cu can be dearly distinguished by the contrast of this color tone. As a result of investigation to improve heat cycle resistance characteristics, the present inventors discovered that the occurrence of cracks in ceramic substrates and separation of copper plates can be suppressed not by controlling the thickness of the brazing material layer, but by controlling the diffusion of Ag toward the copper plate to alleviate the thermal stress generated during heat cycles. By setting the diffusion distance of the Ag to no less than 5 µm, insufficient bonding between the ceramic substrate and the copper plate and separation of the copper plate during heat cycles can be suppressed. By setting the Ag diffusion distance to no greater than 20 µm and suppressing the mechanical properties of the copper plate changing and the copper plate readily accepting thermal stress, the cracks developing in the ceramic substrate during heat cycles and the copper plate separating can be suppressed. It is preferable that the diffusion distance of the Ag is no greater than 15 µm in order to reduce variation in quality. The diffusion distance of the Ag can be adjusted by means of the bonding temperature and bonding time, the amount of the brazing material applied, etc.

A brazing material comprising Ag, Cu, and an active metal is used in bonding the ceramic circuit substrate of the present invention. The compositional ratio of the Ag and Cu is preferably set to that which readily generates a eutectic composition and considering the penetration of copper components from the copper plate, it is preferable that there are 70-95 parts by mass of Ag and 5-30 parts by mass of Cu in a total of 100 parts by mass of the Ag and Cu. By setting the Ag to 70-95 parts by mass, the melting temperature of the brazing material rising and the need to increase the bonding temperature are eliminated and the residual stress due to the difference in coefficients of thermal expansion when bonding increasing and heat cycle resistance readily falling can be suppressed. Further, there are cases in which, if the bonding temperature is increased, it becomes difficult to control the diffusion distance of the Ag.

In one embodiment of the present invention, the active metal is at least one metal selected from titanium, zirconium, hafnium, niobium, etc. The content of the active metal is preferably 0.5-10 parts by mass relative to the total 100 parts by mass of the Ag and Cu. If the content of the active metal is less than 0.5 parts by mass, wettability of the ceramic substrate and the brazing material falls and bond voids readily occur. If the content of the active metal exceeds 10 parts by mass, a fragile nitride layer of the active metal forms in excess at the bonding interface and heat cycle resistance falls. A hydride of the active metal can also be used therein. In this case, hydrogen in the hydride can suppress oxidation of the active metal by the bonding atmosphere, increase reactivity with the ceramic substrate, and improve bondability. Below, cases with conditions using titanium as the active metal shall be described as examples, but the present invention is not limited thereto.

Components other than Ag, Cu, and the active metal can also be added to the brazing material. Among these, adding Sn to lower the melting temperature of the brazing material is preferable. By lowering the melting temperature of the brazing material, the diffusion distance of the Ag becomes readily controlled. The Sn content is preferably 0.1-15 parts by mass relative to the total 100 parts by mass of the Ag and Cu. If the Sn content is less than 0.1 parts by mass, the effect thereof is small and if the content exceeds 15 parts by mass, issues such as the brazing material flowing out when bonding occur and the heat cycle resistance characteristics fall.

An alloy film formed from the above composition, powders of each composition, a powder in which a portion of the composition is alloyed, a powder in which the entire composition is alloyed, etc. can be used in the brazing material. When using a powder, a paste in which the powder is mixed with a bonding agent, plasticizing agent, a dispersing agent, a dispersion medium, etc. can be produced and applied to the ceramic substrate or copper plate. The application method for the brazing material is not particularly limited and publicly known application methods capable of uniformly applying a fixed amount such as screen printing methods, roll coater methods, etc. can be employed. The amount of the brazing material applied is preferably 5-10 mg/cm$^2$ after removal of the dispersion medium. By setting the amount of the brazing material applied to no less than 5 mg/cm$^2$, the ready formation of bond voids can be suppressed and by setting the amount to no greater than 10 mg/cm$^2$, lengthening of the diffusion distance of the Ag and a decrease in the heat cycle resistance characteristics can be suppressed.

By setting the diffusion distance to 5-20 μm, which is shorter than conventionally done, in order to enhance the heat cycle resistance characteristics, there are cases in which the risk of bond failure occurrence increases and strict control of the bonding temperature and bonding time becomes necessary. As a result of investigation in order to achieve both bondability and heat cycle resistance characteristics, the present inventors discovered that preventing the consumption of the active metal in bonding other than reacting with the ceramic substrate and bonding at a low temperature and for a short amount of time are effective. That is, by rapidly raising the temperature such that the heating time in a temperature range from 400-700° C. in a process for raising the temperature to the bonding temperature is 5-30 minutes, bondability is greatly improved and furthermore, bonding by maintaining a bonding temperature of 720-800° C. for 5-30 minutes, heat cycle resistance characteristics that cannot conventionally be obtained can be achieved.

It was discovered that oxidation reactions, nitriding reactions, etc. of the active metal due to unavoidable impurities included in the atmosphere in the bonding furnace or the brazing material progress in the temperature range 400-700° C. in the process for raising the temperature to the bonding temperature, causing bondability to fall. By setting the heating time in this temperature range to 5-30 minutes, the bond void fraction can be made no greater than 1.0% regardless of the atmosphere in the bonding furnace. By setting the heating time to within 30 minutes, wettability of the brazing material falling and bond voids occurring can be suppressed without the active metal substantially reacting with the ceramic substrate. It is more preferable that the heating time be no greater than 20 minutes in order to increase bondability. By setting the heating time to no less than 5 minutes, organic substances such as the bonding agent or plasticizing agent in the brazing material paste are not substantially pyrolyzed and residual carbon components that cause bondability between the ceramic substrate and the copper plate to fall can be suppressed. In a temperature range no less than 400° C., effects on bonding becoming small due to the reaction speed with the active metal being slow can be suppressed. Further, in a temperature range no greater than 700° C., reaction of the active metal due to the atmosphere not readily occurring because of part of the brazing material beginning to melt can be suppressed.

Conventionally, in bonding other than in a vacuum atmosphere, the active metal oxidizes or nitrides when the temperature rises, inviting bond failure, but by performing temperature control as in the present invention, bonding other than in a vacuum atmosphere becomes possible. The manufacturing method for a ceramic circuit substrate in one embodiment of the present invention is characterized by bonding in a continuous heating furnace in a nitrogen atmosphere. The continuous heating furnace here is a heating furnace capable of continuously conveying, with a pusher, belt, roller, etc., a ceramic substrate or copper plate to which a brazing material has been applied, a bonding jig, etc. and thermally treating the same. The continuous heating furnace preferably has a structure capable of supplying gas to the interior of the furnace and exhausting gas to the exterior the furnace. The gas supplied to the interior of the furnace is preferably nitrogen, argon, hydrogen, etc. and among these, is preferably nitrogen from the viewpoint of productivity. The interior of the continuous heating furnace is preferably made a non-oxidizing atmosphere having an oxygen concentration no greater than 50 ppm. By setting the oxygen concentration to no greater than 50 ppm, the brazing material becoming readily oxidized can be suppressed. In order to reduce gaps exposing the brazing material to atmosphere, it is preferable that bonding is performed by applying pressure no less than 1.0 MPa to a laminated body in which the ceramic substrate and copper plate are stacked by using a weight, jig, etc. Publicly known methods can be applied as the heating method and it is preferable that a resistance heating system such as carbon or molybdenum, a high-frequency heating system, a microwave heating system, etc. can be used as the heating source.

The laminated body in which the ceramic substrate and the copper plate are stacked is loaded into the continuous heating furnace, which has a non-oxidizing atmosphere and is kept at a high temperature, and the speed at which the temperature of the laminated body rises can arbitrarily be controlled by adjusting the heat setting temperature and the conveyance speed. It therefore becomes possible to more strictly control the bonding temperature and bonding time than in conventional batch vacuum furnaces. When bonding by maintaining a bonding temperature of 720-800° C. for 5-30 minutes, bonding at a lower temperature and for a shorter time than is conventional is possible, so residual stress after bonding due to the difference in coefficients of thermal expansion of the ceramic substrate and the copper plate falls and furthermore, the diffusion of Ag is suppressed, especially improving heat cycle resistance characteristics. By setting the bonding temperature to no less than 720° C. and the maintenance time to no less than 5 minutes, it is possible to suppress the bonding voids occurring due to insufficient melting of the brazing material. By setting the bonding temperature to no greater than 800° C. and the maintenance time to within 30 minutes, the diffusion distance of Ag lengthening, cracks occurring in the ceramic substrate, and the copper plate separating during heat cycling can be suppressed. It is more preferable that the maintenance time be no longer than 20 minutes in order to enhance the heat cycle resistance characteristics. After bonding, the ceramic circuit substrate is discharged from the bonding furnace and cooled. The cooling speed can also be adjusted by changing the heat setting temperature in the continuous heating furnace.

By continuously bonding in a non-oxidizing atmosphere in this manner, it becomes possible to cut the evacuation step and shorten the time for raising the temperature and the cooling time, especially improving productivity in comparison with conventional batch vacuum furnace systems. Further, because differences do not readily arise in the thermal histories of the obtained ceramic circuit substrates, variation in quality is reduced and stable manufacturing becomes possible.

The ceramic substrate used in the ceramic circuit substrate of the present invention is preferably a silicon nitride substrate or an aluminum nitride substrate having excellent insulation and heat dissipation. The thickness of the ceramic substrate is not particularly limited, but heat resistance increasing is suppressed by setting the thickness to no greater than 1.5 mm and durability being lost is suppressed by setting the thickness to no less than 0.2 mm, so a thickness of 0.2-1.5 mm is preferred.

The copper plate used in the ceramic circuit substrate of the present invention is copper or an alloy comprising copper as a component. The type and thickness are not particularly limited, but the purity is preferably no less than 99.5% because of effects on reactivity with the brazing material and the heat cycle resistance characteristics.

The circuit pattern forming method for the ceramic circuit substrate as in the present invention is not particularly limited and can be carried out by a method comprising masking the copper plate bonded to the ceramic substrate with etching resist in a desired circuit shape and then removing the unnecessary portions by etching, a method comprising bonding, to a ceramic substrate, a copper plate into which a circuit shape has already been punched, etc. The etching method is also not particularly limited and etching liquids such as ferric chloride solution, cupric chloride solution, sulfuric acid, and hydrogen peroxide solution can be used. Among these, the use of ferric chloride solution or cupric chloride solution is preferred. In ceramic circuit substrates in which unnecessary metal portions have been removed by etching, applied brazing material, alloy layers thereof, nitride layers, etc. remain and removing these by using a solution comprising an aqueous solution of ammonium halide, an inorganic acid such as sulfuric acid or nitric acid, or hydrogen peroxide solution is common. Further, separation of the etching resist is performed after the circuit pattern is formed, but the separating method is not particularly limited and a method comprising immersing in an alkali aqueous solution, etc. is common.

Electroless Ni plating, Au flash plating, substitution type Ag plating, etc. can be performed, as necessary, on the copper plate surface of the ceramic circuit substrate of the present invention. An anti-corrosive agent can be applied after surface smoothing by grinding, physical polishing, chemical polishing, etc. without plating.

The ceramic circuit substrate of the present invention can be applied to vehicle-mounted power modules, which demand strict reliability.

Below, the present invention shall be explained in detail with examples. However, the scope of the present invention is not limited by the following examples.

EXAMPLES

Example 1

A brazing material paste in which 2.5 parts by mass of $TiH_2$ powder ("TSH-350" manufactured by OSAKA Titanium technologies Co., Ltd.) and 4 parts by mass of Sn powder ("Tin powder (−325 mesh)" manufactured by Mitsuwa Chemicals Co., Ltd.) were mixed with a total 100 parts by mass of 88 parts by mass of Ag powder ("AgC-BO" manufactured by Fukuda Metal Foil & Powder Co., Ltd.) and 12 parts by mass of Cu powder ("SRC-Cu-20" manufactured by Fukuda Metal Foil & Powder Co., Ltd.) was applied to a 0.32 mm thick silicon nitride substrate with a roll coater such that the application amount was 8 mg/cm². Then, a copper plate for circuit-forming was stacked on one surface of the silicon nitride substrate and a copper plate for forming a heat dissipation board (both are 0.8 mm thick oxygen-free copper plates) was stacked on the other surface of the silicon nitride substrate and the stack was loaded into a conveying roller-type continuous heating furnace (opening dimensions: W 500 mm×H 70 mm, furnace length: 3 m) in a nitrogen atmosphere. The conveyance speed was set to 10 cm/minute and the silicon nitride substrate and the copper plates were bonded by adjusting the set temperature of the heater so as to achieve the bonding conditions shown in Table 1. Etching resist was applied to the bonded copper plate and a circuit pattern was formed by etching with ferric chloride solution. Furthermore, a brazing material layer and nitride layer were removed with an ammonium fluoride/hydrogen peroxide solution.

The following physical properties of the obtained ceramic circuit substrate were measured. The evaluation results are shown in Table 1.

(1) Bond void fraction: Calculated by measuring the surface area of bond voids on the ceramic circuit substrate observed with an ultrasonic flaw detector (Hitachi Engineering FS300-3) and dividing by the surface area of the copper circuit pattern.

(2) Ag diffusion distance: After cutting the ceramic circuit substrate and embedding in resin and polishing the cross-section, backscattered electron images of the fields of view at 3 random locations were captured at a magnification of 500× (a 250 μm range in the horizontal direction of the bonding interface) with a scanning electron microscope and the shortest distance between the ceramic substrate surface and the position of the Ag in the copper plate nearest the copper plate surface was measured.

(3) Crack rate after heat cycles: With one heat cycle defined as being kept 5 minutes on a hot plate at 350° C., 5 minutes at 25° C., 5 minutes at −78° C. in dry ice, and 5 minutes at 25° C., 10 continuous cycles were performed on the ceramic circuit substrate. Then, the copper plate, brazing material layer, and nitride layer were removed by etching, the horizontal cracks generated on the surface of the ceramic substrate were captured at a resolution of 600 dpi×600 dpi with a scanner, and the crack rate was calculated by binarizing (threshold: 140) with the image analysis software GIMP2 and then dividing the horizontal crack surface area by the circuit pattern surface area.

Examples 2-7 and Comparative Examples 2-10

Ceramic circuit substrates were obtained in the same manner as Example 1 other than having changed the bonding atmosphere, the heating time in the temperature range of 400-700° C., the bonding temperature, and the maintenance time as shown in Table 1. The measurement results are shown in Table 1.

Example 8

A ceramic circuit substrate was obtained in the same manner as Example 1 other than not adding the Sn powder and having changed the bonding temperature and maintenance time as shown in Table 1. The measurement results are shown in Table 1.

Example 9

A ceramic circuit substrate was obtained in the same manner as Example 1 other than having changed the amount of the $TiH_2$ powder added to 1.0 part by mass and having changed the heating time in the temperature range of 400-700° C. as shown in Table 1. The measurement results are shown in Table 1.

Comparative Example 1

A ceramic circuit substrate was obtained in the same manner as in Example 1 other than having bonded with the bonding conditions in a conventional vacuum atmosphere batch furnace. The measurement results are shown in Table 1.

Comparative Example 11

A ceramic circuit substrate was obtained in the same manner as in Example 1 other than not adding the TiH$_2$ powder.

The measurement results are shown in Table 1.

In Comparative Examples 5, 6, and 11, the bond void fractions were high and the copper plates separated during heat cycle, so the crack rate could not be properly evaluated.

TABLE 1

| | Bonding Atmosphere | Heating Time between 400-700° C. (minutes) | Bonding Temperature (° C.) | Maintenance Time (minutes) | Bond Void Fraction (%) | Ag Diffusion Distance (μm) | Crack Rate after Heat Cycles (%) |
|---|---|---|---|---|---|---|---|
| Example 1 | Nitrogen | 18 | 750 | 18 | 0.08 | 12 | 0.2 |
| Example 2 | Nitrogen | 22 | 750 | 18 | 0.24 | 14 | 0.3 |
| Example 3 | Nitrogen | 18 | 750 | 25 | 0.06 | 17 | 0.5 |
| Example 4 | Nitrogen | 5 | 750 | 25 | 0.88 | 18 | 0.6 |
| Example 5 | Nitrogen | 28 | 750 | 25 | 0.92 | 17 | 0.5 |
| Example 6 | Nitrogen | 18 | 725 | 7 | 0.65 | 6 | 0.1 |
| Example 7 | Nitrogen | 18 | 790 | 28 | 0.04 | 19 | 0.9 |
| Example 8 | Nitrogen | 18 | 795 | 28 | 0.94 | 19 | 0.9 |
| Example 9 | Nitrogen | 15 | 750 | 18 | 0.70 | 16 | 0.4 |
| Comparative Example 1 | Vacuum | 60 | 750 | 120 | 0.10 | 42 | 14.6 |
| Comparative Example 2 | Nitrogen | 60 | 750 | 25 | 3.21 | 18 | 0.8 |
| Comparative Example 3 | Nitrogen | 3 | 750 | 25 | 1.19 | 18 | 0.6 |
| Comparative Example 4 | Nitrogen | 32 | 750 | 25 | 1.35 | 17 | 0.6 |
| Comparative Example 5 | Nitrogen | 18 | 710 | 25 | 21.20 | 3 | Copper Plate Separation |
| Comparative Example 6 | Nitrogen | 18 | 710 | 120 | 10.87 | 4 | Copper Plate Separation |
| Comparative Example 7 | Nitrogen | 18 | 820 | 25 | 0.04 | 25 | 3.4 |
| Comparative Example 8 | Nitrogen | 18 | 820 | 3 | 0.07 | 23 | 2.6 |
| Comparative Example 9 | Nitrogen | 18 | 750 | 3 | 1.50 | 5 | 0.7 |
| Comparative Example 10 | Nitrogen | 18 | 750 | 34 | 0.08 | 22 | 1.8 |
| Comparative Example 11 | Nitrogen | 18 | 750 | 25 | 34.56 | 3 | Copper Plate Separation |

According to the measurement results in Table 1, the ceramic circuit substrates of the present invention have low bond voids at no greater than 1.0%, excellent bondability, low crack rates after heat cycles at no greater than 1.0%, and excellent heat cycle resistance characteristics and high performance power modules can be provided in a productive manner.

INDUSTRIAL APPLICABILITY

The ceramic circuit substrate of the present invention can suitably be used in vehicle-mounted power modules.

The invention claimed is:

1. A ceramic circuit substrate comprising a ceramic substrate bonded with a copper plate via a brazing material comprising Ag, Cu, and an active metal,
   wherein a bond void fraction is no greater than 1.0%, and
   a diffusion distance between a surface of the ceramic substrate, which is in contact with the brazing material, and a maximum point at which the Ag diffuses in a copper plate thickness direction from the surface of the ceramic substrate into the copper plate is 5-20 μm.

2. The ceramic circuit substrate according to claim 1, wherein the ceramic substrate comprises silicon nitride or aluminum nitride.

3. The ceramic circuit substrate according to claim 1, wherein the brazing material comprises Sn.

4. A manufacturing method for the ceramic circuit substrate according to claim 1, wherein a heating time in a temperature range 400-700° C. in a process for raising the temperature to a bonding temperature is 5-30 minutes and bonding is performed by maintaining the bonding temperature at 720-800° C. for 5-30 minutes.

5. The manufacturing method for a ceramic circuit substrate according to claim 4, further comprising bonding in a continuous heating furnace in a nitrogen atmosphere.

6. A power module using the ceramic circuit substrate according to claim 1.

7. The ceramic circuit substrate according to claim 2, wherein the brazing material comprises Sn.

8. A manufacturing method for the ceramic circuit substrate according to claim 2, wherein a heating time in a temperature range 400-700° C. in a process for raising the temperature to a bonding temperature is 5-30 minutes and bonding is performed by maintaining the bonding temperature at 720-800° C. for 5-30 minutes.

9. A manufacturing method for the ceramic circuit substrate according to claim 3, wherein the heating time in a temperature range 400-700° C. in a process for raising the temperature to a bonding temperature is 5-30 minutes and bonding is performed by maintaining the bonding temperature at 720-800° C. for 5-30 minutes.

10. A manufacturing method for the ceramic circuit substrate according to claim 7, wherein a heating time in a temperature range 400-700° C. in a process for raising the temperature to a bonding temperature is 5-30 minutes and bonding is performed by maintaining the bonding temperature at 720-800° C. for 5-30 minutes.

11. The manufacturing method for a ceramic circuit substrate according to claim 8, further comprising bonding in a continuous heating furnace in a nitrogen atmosphere.

12. The manufacturing method for a ceramic circuit substrate according to claim 9, further comprising bonding in a continuous heating furnace in a nitrogen atmosphere.

13. The manufacturing method for a ceramic circuit substrate according to claim 10, further comprising bonding in a continuous heating furnace in a nitrogen atmosphere.

14. A power module using the ceramic circuit substrate according to claim 2.

15. A power module using the ceramic circuit substrate according to claim 3.

16. A power module using the ceramic circuit substrate according to claim 7.

* * * * *